(12) United States Patent
Keilers et al.

(10) Patent No.: US 10,545,544 B2
(45) Date of Patent: Jan. 28, 2020

(54) CHASSIS OUTER SURFACE SUPPLEMENTAL PASSIVE COOLING SYSTEM

(71) Applicant: Dell Products L.P., Round Rock, TX (US)

(72) Inventors: Cyril Adair Keilers, Georgetown, TX (US); Shawn Paul Hoss, Georgetown, TX (US); Christopher Michael Helberg, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/428,672

(22) Filed: May 31, 2019

(65) Prior Publication Data

US 2019/0339749 A1 Nov. 7, 2019

Related U.S. Application Data

(63) Continuation of application No. 15/973,234, filed on May 7, 2018, now Pat. No. 10,338,650.

(51) Int. Cl.
*G06F 1/20* (2006.01)
*H05K 7/20* (2006.01)
*G06F 1/16* (2006.01)

(52) U.S. Cl.
CPC .............. *G06F 1/20* (2013.01); *G06F 1/1601* (2013.01); *H05K 7/20154* (2013.01); *H05K 7/20336* (2013.01); *G06F 2200/1612* (2013.01); *G06F 2200/1631* (2013.01); *G06F 2200/201* (2013.01)

(58) Field of Classification Search
CPC combination set(s) only.
See application file for complete search history.

(56) References Cited

U.S. PATENT DOCUMENTS

| | | |
|---|---|---|
| 5,757,615 A | 5/1998 | Donahoe et al. |
| 5,910,883 A | 6/1999 | Cipolla et al. |
| 6,097,597 A | 8/2000 | Kobayashi |
| 6,226,178 B1 | 5/2001 | Broder et al. |
| 6,288,896 B1 | 9/2001 | Hsu |
| 6,519,146 B2 | 2/2003 | Nagashima et al. |
| 6,674,642 B1 | 1/2004 | Chu et al. |
| 6,798,655 B2 | 9/2004 | Nagashima et al. |
| 7,561,426 B2 | 7/2009 | Jeong |

(Continued)

*Primary Examiner* — Lisa Lea-Edmonds
(74) *Attorney, Agent, or Firm* — Haynes and Boone, LLP (57) ABSTRACT

A cooling system includes a chassis defining a housing and including a wall having an outer surface. A computing device is located in the housing. A heat transfer device located in the housing engages the computing device and the wall, providing for heat transfer from the computing device, through the heat transfer device, and through the wall to the outer surface to produce supplemental passive cooling of the computing device via the outer surface. A heat dissipation aperture is defined by the chassis, and a heat dissipation device located in the housing adjacent the heat dissipation aperture engages the heat transfer device, which provides for heat transfer from the heat transfer device to the heat dissipation device. A forced convection device located in the housing generates an airflow past the heat dissipation structure and through the heat dissipation aperture to enable primary active cooling of the computing device.

20 Claims, 11 Drawing Sheets

(56) References Cited

U.S. PATENT DOCUMENTS

| | | |
|---|---|---|
| 7,593,226 B2 | 9/2009 | Yamanaka |
| 8,248,780 B2 * | 8/2012 | Zheng .................. G06F 1/16 361/679.47 |
| 8,289,715 B2 | 10/2012 | Takahara |
| 8,320,119 B2 | 11/2012 | Isoshima et al. |
| 8,599,552 B2 * | 12/2013 | Lee ..................... G06F 1/20 361/679.54 |
| 9,575,521 B1 | 2/2017 | North et al. |
| 2004/0174675 A1 * | 9/2004 | Liu ..................... G06F 1/16 361/679.47 |
| 2006/0232919 A1 | 10/2006 | Jeong |
| 2006/0290812 A1 * | 12/2006 | Hsu ..................... G06F 1/16 361/679.46 |
| 2008/0068806 A1 | 3/2008 | Han et al. |
| 2012/0057290 A1 | 3/2012 | Shen et al. |
| 2013/0021747 A1 | 1/2013 | Guan |

\* cited by examiner

CHASSIS OUTER SURFACE SUPPLEMENTAL PASSIVE COOLING SYSTEM

CROSS-REFERENCE TO RELATED APPLICATIONS

This is a Continuation application to U.S. Utility application Ser. No. 15/973,234 filed May 7, 2018, entitled "CHASSIS OUTER SURFACE SUPPLEMENTAL PASSIVE COOLING SYSTEM," the disclosure of which is incorporated herein by reference in its entirety.

BACKGROUND

The present disclosure relates generally to information handling systems, and more particularly to providing supplemental passive cooling of information handling system components via an outer surface of the information handling system chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The desire to decrease the size of information handling systems while continuing to increase their performance results in a variety of issues. For example, information handling systems such as laptop/notebook computing devices, tablet computing devices, and/or other relatively thin computing devices known in the art typically include processors, memory devices, and/or other components that generate relatively high amounts of heat and require corresponding cooling. To provide such cooling, many computing devices implement heat pipes or vapor chambers as a transport mechanism to move heat from the heat-generating component to a heat dissipation device (e.g., a heat sink), along with a forced convection device (e.g., a fan, blower, etc.) that generates an airflow past the heat dissipation device to dissipate heat generated by the component, with such forced convection device/heat dissipation device combinations typically operating as the sole means for dissipating heat generated by the component. In addition, computing devices often limit the maximum outer surface temperatures that may be generated in order to ensure user comfort, which requires that the heat transport mechanisms be offset from the chassis walls to prevent direct heat transfer from the heat transport mechanism to the chassis wall that can cause the outer surface of the chassis from exceeding those maximum outer surface temperatures, and the implementation of such offsets increase the thickness of the system. Furthermore, the capabilities of processors and other components continue to be increased, resulting in higher and higher amounts of corresponding generated heat. For example, many new processors include the ability to function in "bursts" for short periods of time, which has been found to be capable of generating heat that can exceed the ability of the forced convection device/heat dissipation device combination, and requires that the burst functionality of the processor be throttle or even disabled in some systems.

Accordingly, it would be desirable to provide an improved cooling system.

SUMMARY

According to one embodiment, an Information Handling System (IHS) includes a first chassis that defines a first chassis housing and that includes a first chassis wall having a first chassis outer surface that is located opposite the first chassis wall from the first chassis housing; a heat producing component that is located in the first chassis housing and that is configured to generate heat; a heat transfer device that is located in the first chassis housing and that engages the heat producing component and the first chassis wall, wherein the engagement of the heat producing component, the heat transfer device, and the first chassis wall provides for the transfer of heat from the heat producing component, through the heat transfer device, and through the first chassis wall to the first chassis outer surface in order to enable supplemental passive cooling of the heat producing component via the first chassis outer surface; a heat dissipation aperture that is defined by the first chassis and that extends through the first chassis to the first chassis housing; a heat dissipation device that is located in the first chassis housing adjacent the heat dissipation aperture and that engages the heat transfer device, wherein the engagement of the heat dissipation device and the heat transfer device provides for the transfer of heat from the heat transfer device to the heat dissipation device; and a forced convection device that is located in the first chassis housing adjacent the heat dissipation structure, wherein the forced convection device is configured to generate an airflow past the heat dissipation structure and out of the first chassis through the heat dissipation aperture to enable primary active cooling of the heat producing component.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
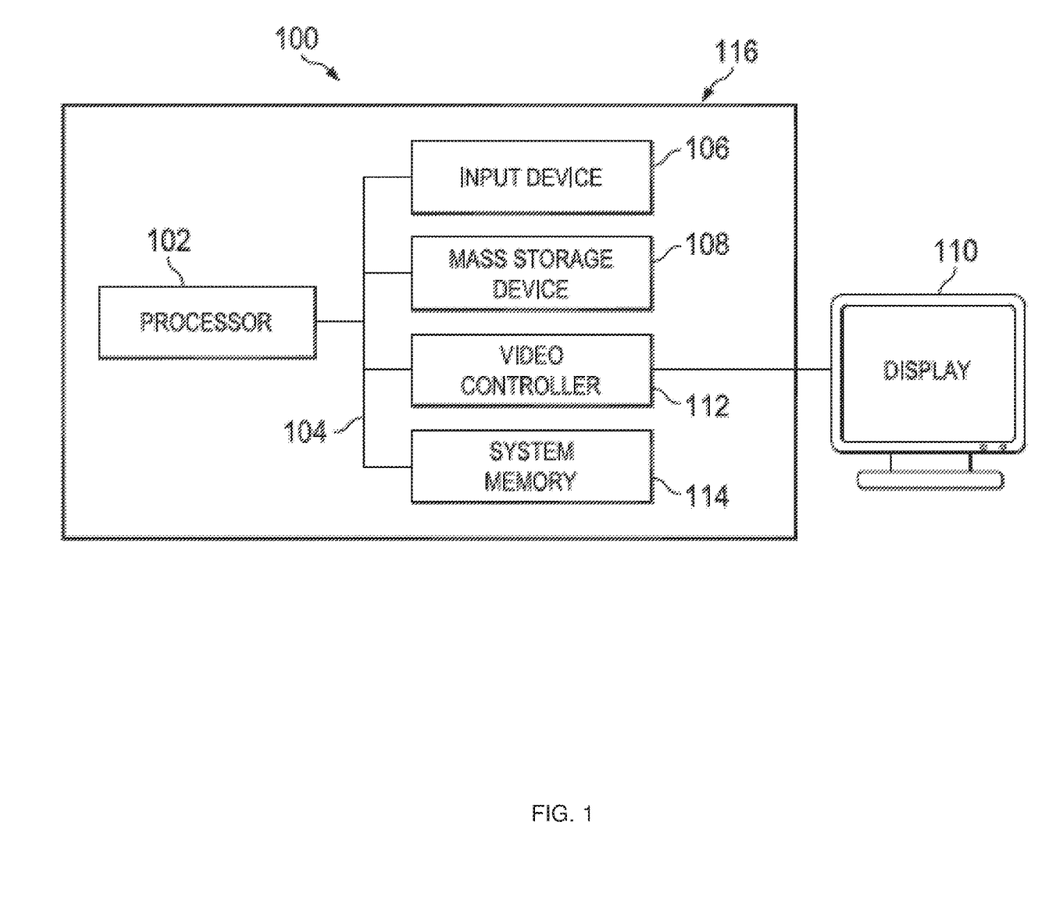
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
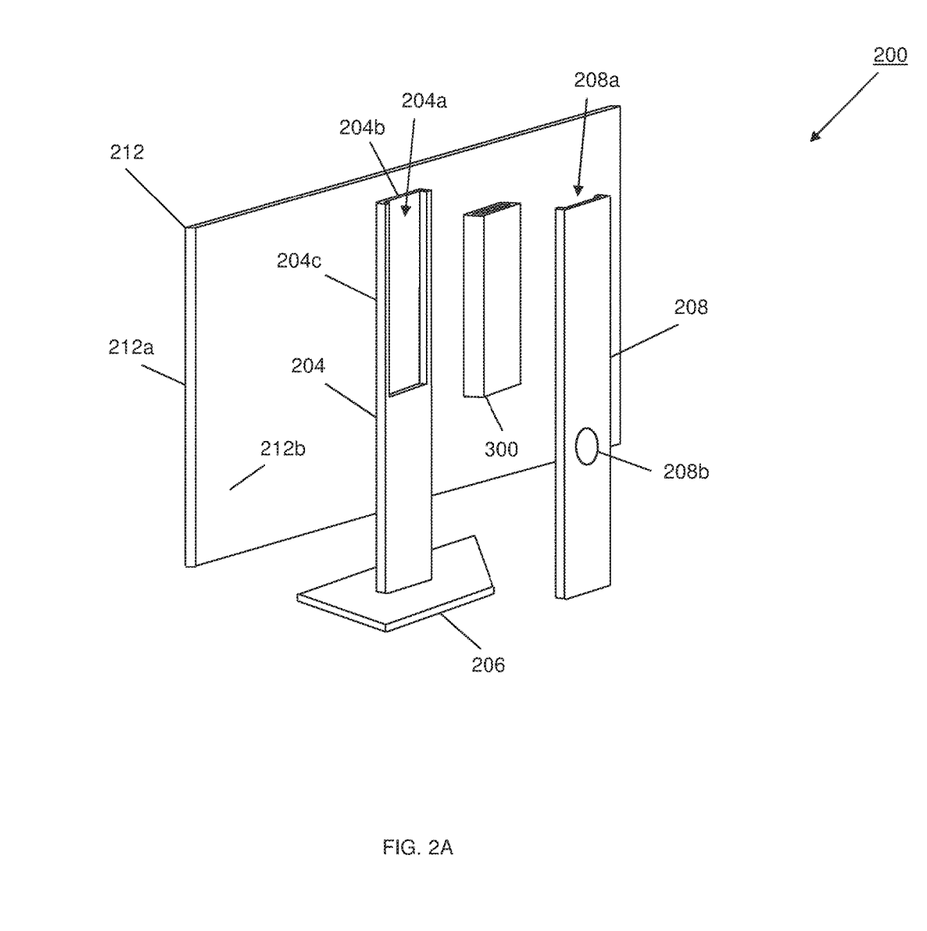
FIG. 2A is a rear perspective view illustrating an embodiment of a computing device.
Figure 2B:
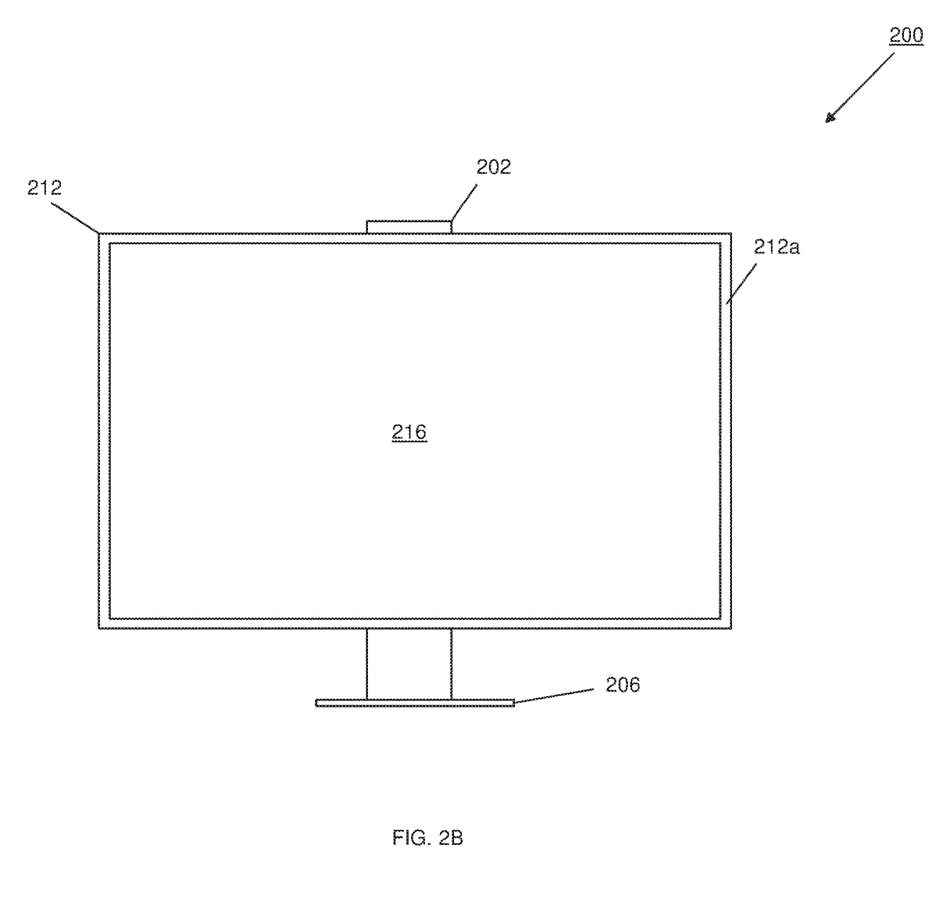
FIG. 2B is a front view illustrating an embodiment of the computing device of FIG. 2A.
Figure 2C:
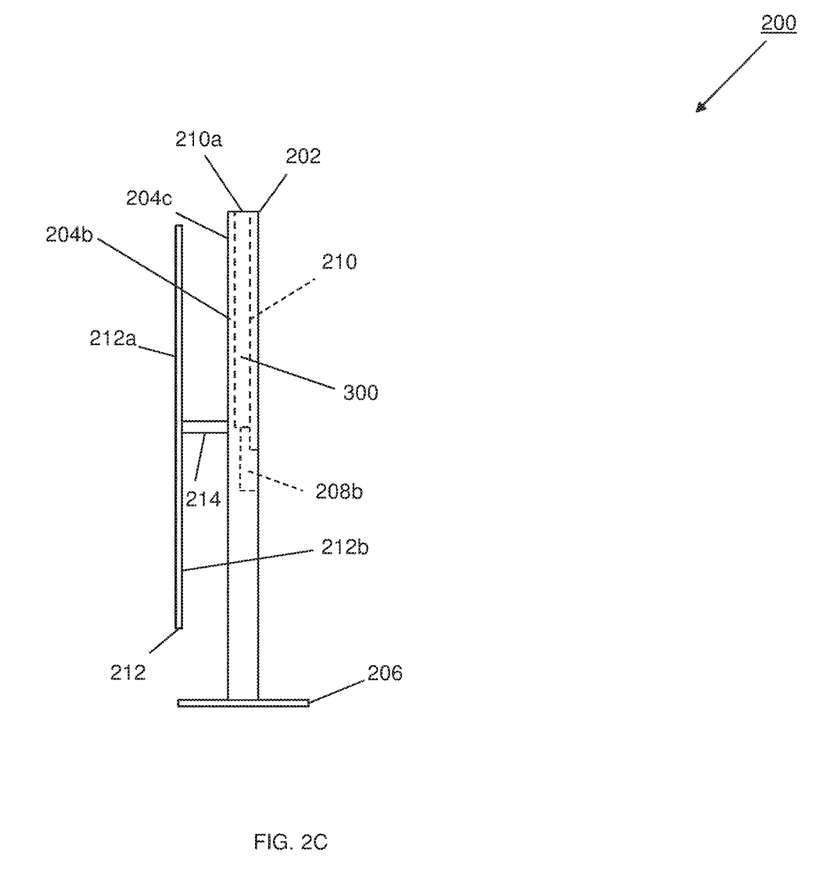
FIG. 2C is a side view illustrating an embodiment of the computing device of FIGS. 2A and 2B.

Referring now to FIGS. 2A, 2B, and 2C, an embodiment of computing system 200 is illustrated. In an embodiment, the computing system 200 may be provided by the IHS 100 discussed above with reference to FIG. 1, and/or may include some or all of the components of the IHS 100. In the embodiments illustrated and described herein, the computing system 200 is provide by a computing module that provides the compute functionality (e.g., processing, storage, etc.) of the computing system 200, with that computing module housed in a display stand chassis that supports a display device. However, one of skill in the art in possession of the present disclosure will recognize that other computing systems such as, for example, server computing systems, desktop computing systems, laptop/notebook computing systems, and/or other computing systems known in the art may benefit from the teachings of the present disclosure and, as such, will fall within its scope as well. In the illustrated embodiment, the computing system 200 includes a display stand chassis 202 having a first display stand chassis portion 204 that is mounted to a display stand base 206 and that defines a first display stand chassis housing portion 204a adjacent a display stand chassis wall 204b that includes a display stand chassis outer surface 204c. The display stand chassis 202 in the illustrated embodiment also includes a second display stand chassis portion 208 that defines a second display stand chassis housing portion 208a, with the second display stand chassis portion 208 configured to couple to the first display stand chassis portion 204 such that the first display stand chassis housing portion 204a and the second display stand chassis housing portion 208a define a display stand chassis housing 210. In an embodiment, the display stand chassis 202 and/or at least some of its components (e.g., first display stand chassis housing portion 204a) may be provided by a die cast metal or other material that provides for relatively high heat transfer rates. The display stand chassis housing 210 includes a display stand heat dissipation aperture 210a that is located opposite the display stand chassis 202 from the display stand base 206. As discussed in further detail below, the display stand heat dissipation aperture 210a provides an air outlet for the display stand chassis housing 210. As illustrated, the second display stand chassis portion 208 may also define a display stand chassis housing air inlet 208b that, as discussed below, allows for air to be drawn into the display stand chassis housing 210.

A display device 212 is coupled to the display stand chassis 202 by at least one support member 214. The display device 212 has a first side 212a that includes a display screen 216, and a second side 212b that is located opposite the display device 212 from the first side 212a (e.g., providing a rear surface of the display device 212.) As can be seen in FIG. 2C, the display stand chassis outer surface 204c on the display stand chassis 202 faces the second side 212b of the display device 212b which, as discussed below, reduces the chances of or, in some cases, substantially eliminates, contact between a user and the display stand chassis outer surface 204c. A computing module 300 is configured to be positioned in the display stand chassis housing 210 (i.e., when the second display stand chassis housing portion 208a is coupled to the first display stand chassis portion 204), and is discussed in further detail below with reference to FIGS. 3A, 3B, and 3C. While not illustrated, one of skill in the art in possession of the present disclosure will recognize that the display stand chassis 202 may include a variety of mounting structures, securing elements, connections (e.g., display connections, power connections, etc.), and/or any other coupling features that enable the computing module 300 to be coupled to the display stand chassis 202, as well enable the components in the computing module 300 to be coupled to the display device 212, a power source, and/or other computing system elements (e.g., peripheral devices) while remaining within the scope of the present disclosure. While a specific computing system has been described, one of skill in the art in possession of the present disclosure will recognize that computing systems may include other components and/or component configurations while remaining within the scope of the present disclosure as well.

Figure 3A:
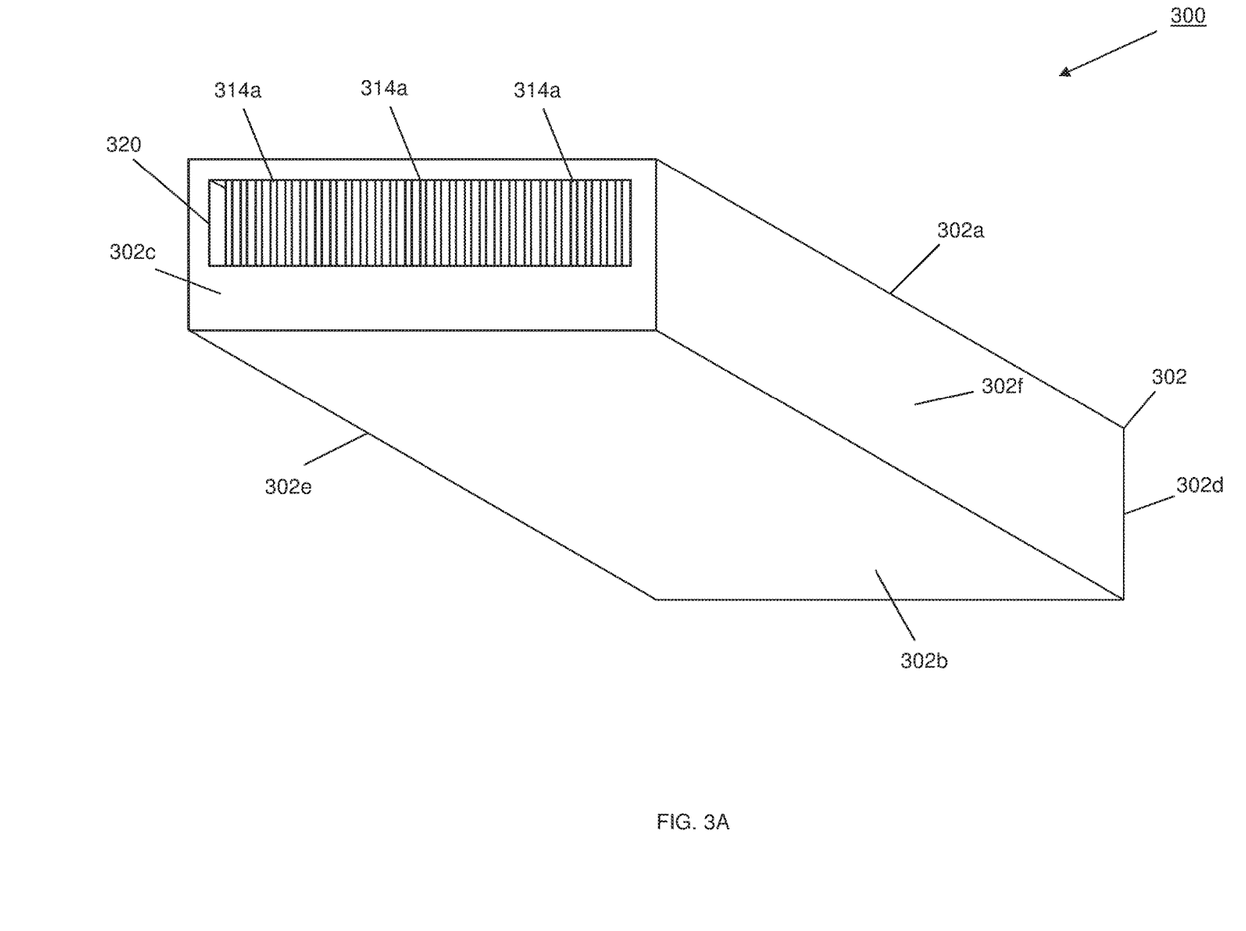
FIG. 3A is a bottom perspective view illustrating an embodiment of a computing module included in the computing device 200 of FIGS. 2A, 2B, and 2C.
Figure 3B:
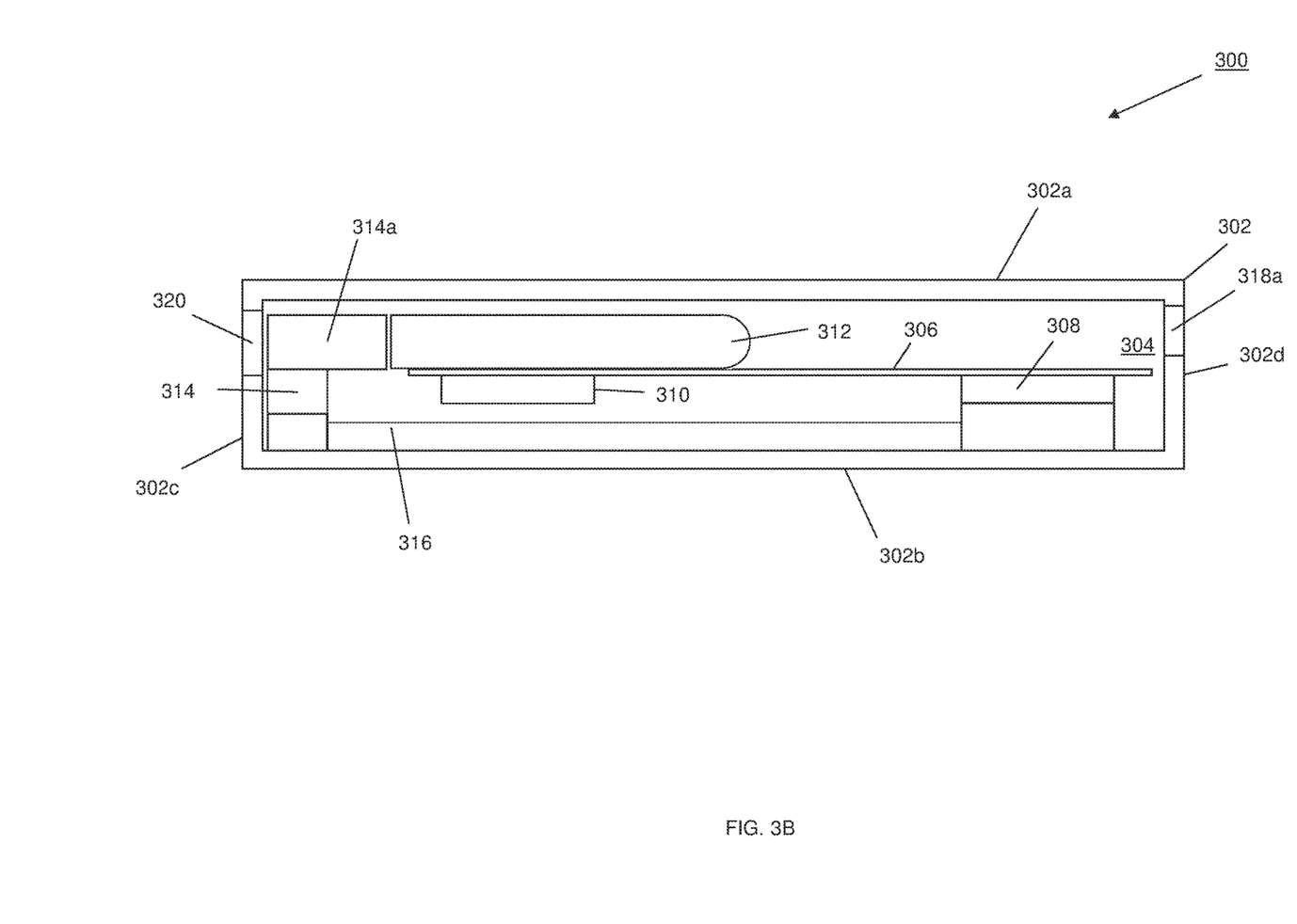
FIG. 3B is a partial cross-sectional view illustrating an embodiment of the computing module of FIG. 3A.
Figure 3C:
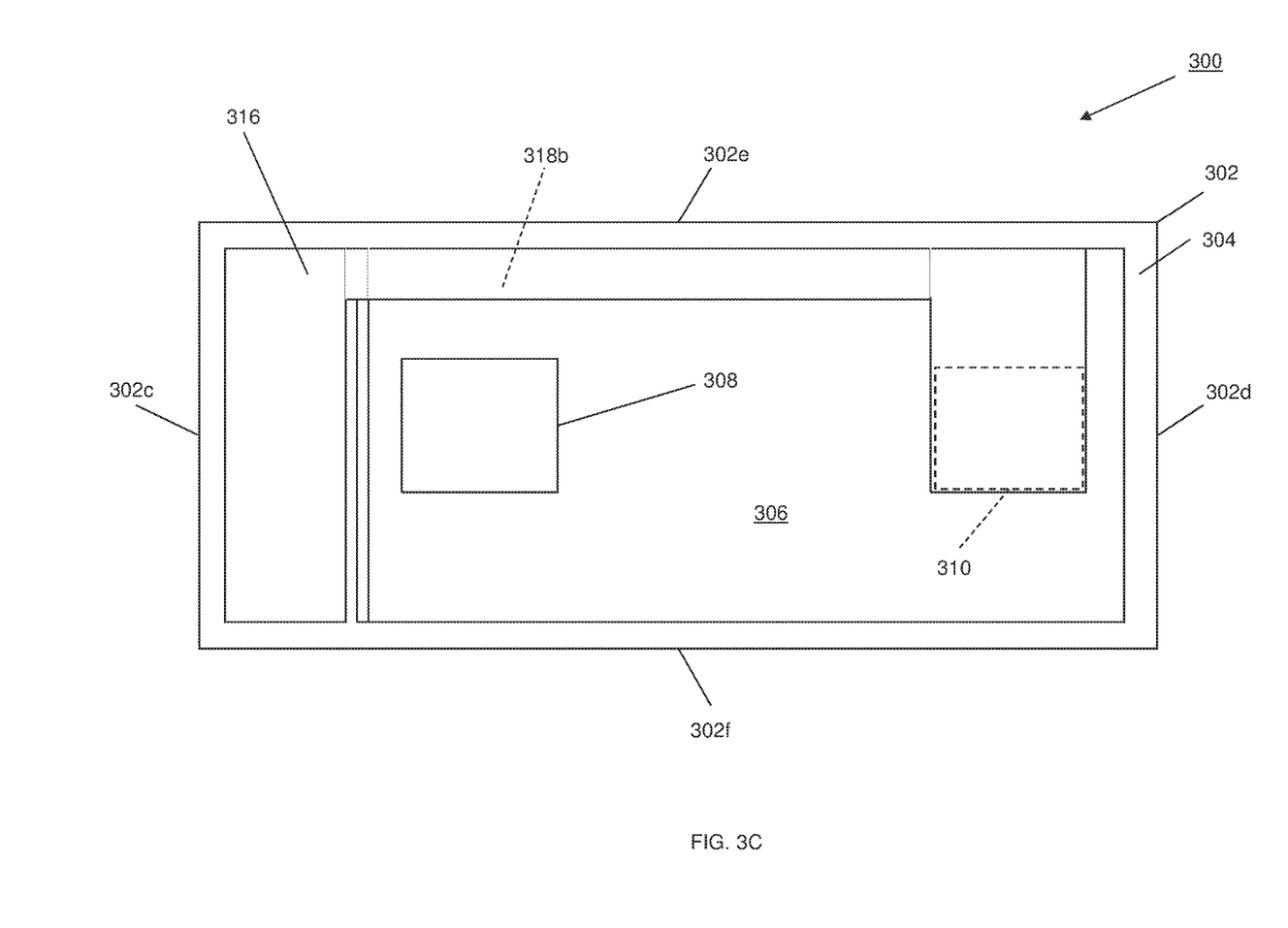
FIG. 3C is a partial cross-sectional view illustrating an embodiment of the computing module of FIGS. 3A and 3B.

Referring now to FIGS. 3A, 3B, and 3C, an embodiment of a computing module 300 is illustrated. In an embodiment, the computing module 300 may be the IHS 100 of FIG. 1, and/or may include some or all of the components of the IHS 100. While the computing module 300 is illustrated and described herein as being housed in a display stand chassis and coupled to a display device on that display stand chassis, the teaching of the present disclosure may be beneficial to a variety of devices and/or systems that can benefit from the supplement passive cooling described herein, and thus those devices and systems are envisioned as falling within the scope of the present disclosure as well. In the illustrated embodiment, the computing module 300 includes a computing chassis 302 that may house components (e.g., of the IHS 100), only some of which are illustrated in FIGS. 3A-C. The computing chassis 302 includes a computing chassis top outer surface 302a, a computing chassis bottom outer surface 302b that is located opposite the computing chassis 302 from the computing chassis top outer surface 302a, a computing chassis front outer surface 302c that extends between the computing chassis top outer surface 302a and the computing chassis bottom outer surface 302b, a computing chassis rear outer surface 302d that is located opposite the computing chassis 302 from the computing chassis front outer surface 302c and that extends between the computing chassis top outer surface 302a and the computing chassis bottom outer surface 302b, and a pair of opposing computing chassis side outer surfaces 302e and 302f that are located opposite the computing chassis 302 from each other and that extend between the computing chassis top outer surface 302a, the computing chassis bottom outer surface 302b, the computing chassis front outer surface 302c, and the computing chassis rear outer surface 302d. In an embodiment, the computing chassis 302 and/or at least some of its components (e.g., the computing chassis wall that includes the computing chassis bottom outer surface 302b) may be provided by a die cast metal or other material that provides for relatively high heat transfer rates.

As illustrated in FIGS. 3B and 3C, the computing chassis 302 defines a computing chassis housing 304 between the computing chassis top outer surface 302a, the computing chassis bottom outer surface 302b, the computing chassis front outer surface 302c, the computing chassis rear outer surface 302d, and the computing chassis side outer surfaces 302e and 202f, and that computing chassis housing 304 may be utilized to house components (e.g., of the IHS 100). As can be seen in FIGS. 3B and 3C, the components housed in the computing chassis housing 304 may include a board 306 (e.g., a motherboard) to which a first heat producing component 308 and a second heat producing component 310 are mounted. In some embodiments, the first heat producing component 308 and/or the second heat producing component 310 may be provided by, for example, a processing system (e.g., a Central Processing Unit (CPU)), a memory system (e.g., Dynamic Random Access Memory (DRAM) devices), and/or a variety of other computing devices that would be apparent to one of skill in the art in possession of the present disclosure. However, in other embodiments, the first and second heat producing components may be provided by any heat producing devices that would be apparent to one of skill in the art in possession of the present disclosure.

In the illustrated embodiment, a forced convection device 312 is located on the board 306 and in the computing chassis housing 304 between the board 306 and the computing chassis wall of the computing chassis 302 that includes the computing chassis top outer surface 302a. The forced convection device 312 may be provided by a fan, a blower, and/or other forced convection devices that would be apparent to one of skill in the art in possession of the present disclosure. A heat dissipation structure 314 is located in the computing chassis housing 304 adjacent the forced convection device 312, and in the illustrated embodiment includes a plurality of spaced apart heat dissipation fins 314a that define a plurality of airflow channels (i.e., between the heat dissipation fins 314a) extending from the forced convection device 312. A heat transfer device 316 (e.g., a heat pipe, a vapor chamber, or other heat transfer subsystem that would be apparent to one of skill in the art in possession of the present disclosure) is located in the computing chassis housing 304, engages the heat dissipation structure 314, extends through the computing chassis housing 304 while engaging the computing chassis wall that includes the bottom outer surface 302b of the computing chassis 302, and engages the first heat producing component 308.

While not illustrated, one of skill in the art in possession of the present disclosure will recognize that thermal substrates (e.g., heat transfer pastes) may be provided between the engagement of the heat transfer device 316 and the heat dissipation structure 314, the engagement of the heat transfer device 316 and the computing chassis wall that includes the bottom outer surface 302b of the computing chassis 302, and the engagement of the heat transfer device 316 and the first heat producing component 308 (e.g., the engagement of the evaporator side of the heat pipe and a Central Processing Unit (CPU)). As discussed below, the heat transfer device 316 may be configured to transfer a portion of the heat generated by the first heat producing component 308 to the heat dissipation structure 314, while also transferring a portion of the heat generated by the first heat producing component 308 to the computing chassis wall that includes the bottom outer surface 302b. While the heat transfer device 316 is described as a heat pipe that engages the computing chassis wall that includes the bottom outer surface 302b of the computing chassis 302, in other embodiments, the heat transfer device 316 may be integrated, embedded, or otherwise engaged with the computing chassis wall that includes the bottom outer surface 302b of the computing chassis 302 in a variety of manners that will fall within the scope of the present disclosure as well.

In the illustrated embodiment, a computing chassis housing air inlet 318a is defined by the computing chassis wall of the computing chassis 302 that includes the computing chassis side outer surface 302d. As discussed below, the computing chassis housing air inlet 318a is configured to allow air to be drawn from outside the computing chassis 302 and into the computing chassis housing 304 to the forced convection device 312. Furthermore, a computing chassis heat dissipation aperture 320 is defined by the wall of the computing chassis 302 that includes the computing chassis front outer surface 302c of the computing chassis 302, and is located immediately adjacent the heat dissipation fins 314a and opposite the heat dissipation fins 314a from the forced convection device 312. As discussed below, the forced convection device 312 is configured to produce an airflow that is directed through the channels defined by the heat dissipation fins 314a, and out the computing chassis heat dissipation aperture 320. However, while specific air inlets and outlets have been illustrated and described, one of skill in the art in possession of the present disclosure will recognize that air inlets and outlets for the computing module 300 may be located in a variety of locations that will fall within the scope of the present disclosure.

As illustrated in FIGS. 2A and 2B, the computing module 300 may be positioned in the display stand chassis housing 210 of the display stand chassis 202 such that the computing chassis bottom outer surface 302b on the computing chassis wall of the computing chassis 302 engages the display stand chassis wall 204b having the display stand chassis outer surface 204c, with the computing module heat dissipation aperture 320 is located immediately adjacent the display stand heat dissipation aperture 210a, and the computing chassis housing air inlet 318a located adjacent the display stand chassis housing air inlet 208b such that air may be drawn from outside the display stand chassis 202 and into the computing chassis housing 304. However, while a specific computing module has been described, computing modules may include different components and/or configurations that will fall within the scope of the present disclosure as well.

Figure 4:
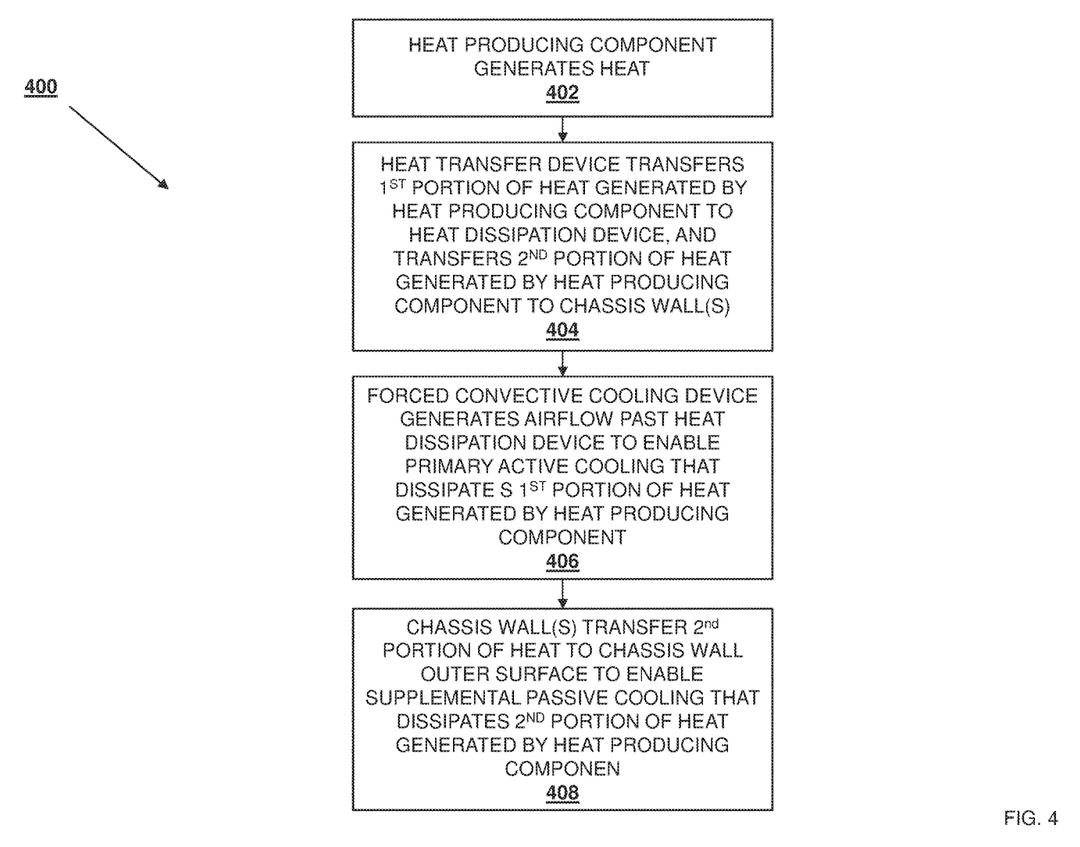
FIG. 4 is a flow chart illustrating an embodiment of a method for providing supplemental passive cooling.

Referring now to FIG. 4, an embodiment of a method 400 for providing supplemental passive cooling is illustrated. As discussed below, the systems and methods of the present disclosure provide a heat transfer device in a chassis that engages each of a heat producing component, a chassis wall of the chassis, and a heat dissipation device included in the chassis. When the heat producing component produces heat, the heat transfer device transfers a first portion of the heat from the heat producing component to the heat dissipation device, and a forced convection device operates to produce an airflow past that heat dissipation device and out of a heat dissipation aperture in the chassis to provide for primary active cooling of the heat producing component. In addition, a second portion of the heat from the heat producing component is transferred by the heat transfer device to the chassis wall, and the chassis wall transfers that second portion of the heat to a chassis outer surface to provide for supplemental passive cooling of the heat producing component. As such, supplemental cooling is provided to heat producing components which, in some cases, may provide for increased operations of those heat producing components, as well as enable the use of smaller and/or reduced cost thermal dissipation devices (e.g., smaller heat sinks, smaller heat pipes, smaller fans, etc.)

The method 400 begins at block 402 where a heat producing component generates heat. In an embodiment, at block 402, the first heat producing component 308 may operate to produce heat. For example, the first heat producing component 308 may be provided by a computing device such as a processing system, a memory system, and/or other computing devices known in the art, and at block 402 that computing device may operate and, as a result, produce heat. In a specific example, the operation of a processing system to produce heat at block 402 may include that processing system performing in a "burst mode" that utilizes increased power, and generates increased heat relative to normal operation of the processing system. However, while some specific heat producing operations for the first heat producing component 308 have been described, one of skill in the art in possession of the present disclosure will recognize that heat may be produced by a component in a variety of manners that will fall within the scope of the present disclosure as well.

Figure 5A:
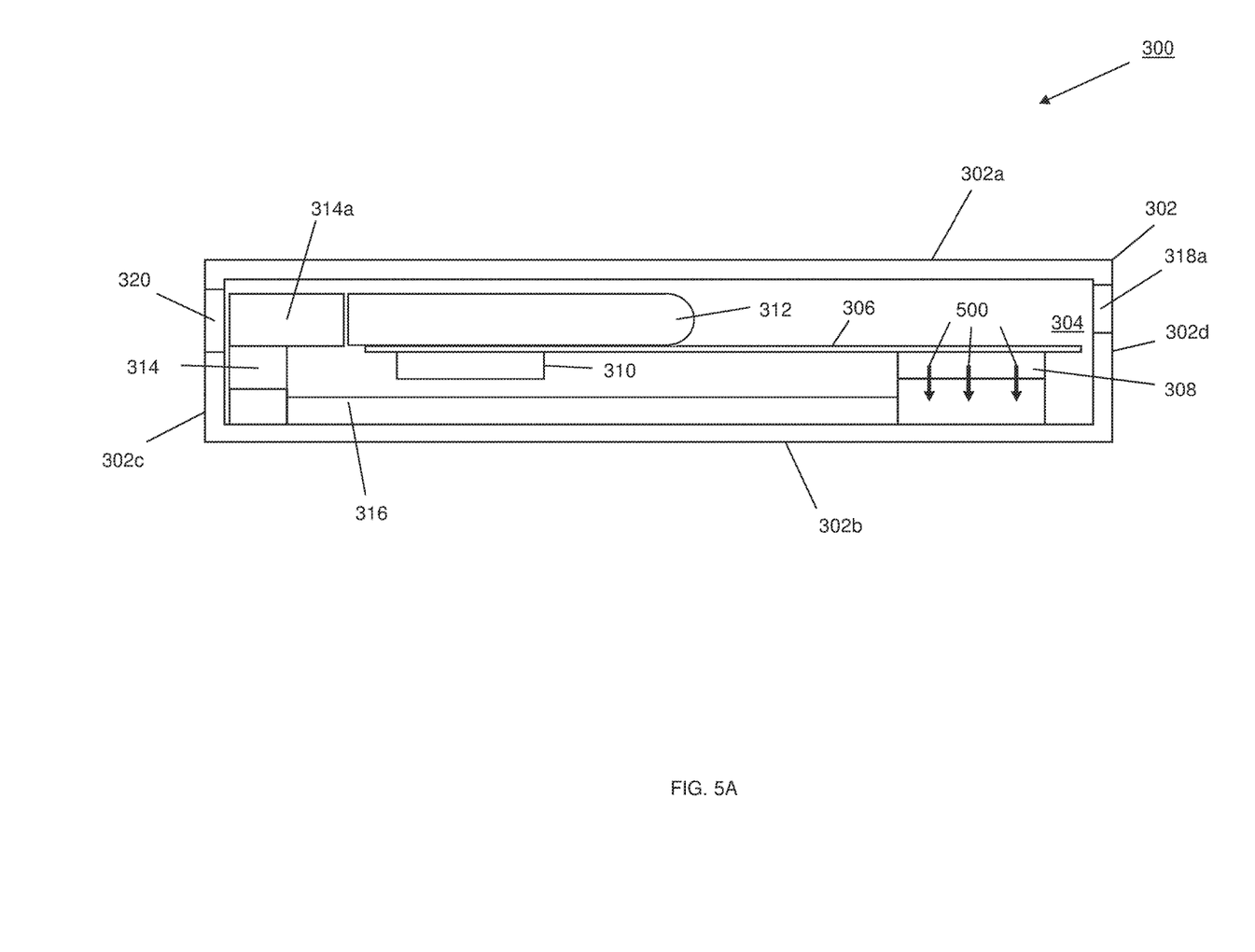
FIG. 5A is a partial cross-sectional view of heat transfer in the computing module of FIGS. 3A, 3B, and 3C.
Figure 5B:
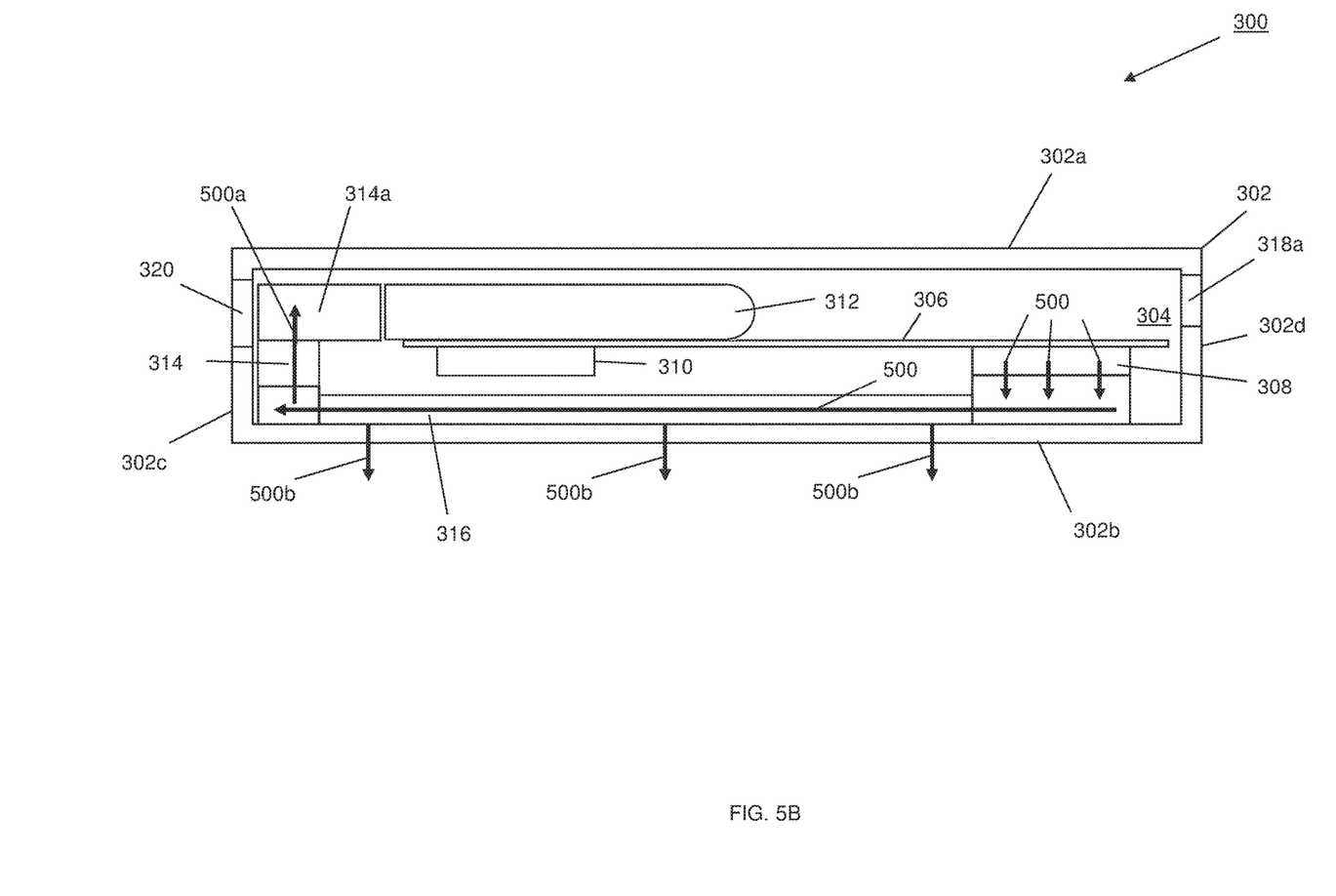
FIG. 5B is a partial cross-sectional view of heat transfer in the computing module of FIGS. 3A, 3B, and 3C.

The method 400 then proceeds to block 404 where a heat transfer device transfers a first portion of the heat generated by the heat producing component to a heat dissipation device, and transfers a second portion of the heat generated by the heat producing component to chassis wall(s). In an embodiment, at block 404, the heat transfer device 316 may operate to transfer a first portion of the heat generated by the first heat producing component 308 to the heat dissipation device 314, and transfer a second portion of the heat generated by the first heat producing component 308 to the computing chassis wall that includes the computing chassis bottom outer surface 302b. For example, FIG. 5A illustrates the first heat producing component 308 producing heat 500, and how that heat 500 is transferred from the first heat producing component 508 and to the heat transfer device 316 via the engagement of the first heat producing component 508 and the heat transfer device 316. Furthermore, FIG. 5B illustrates how the heat transfer device 316 transfers that heat 500 along its length, and how a first portion 500a of the heat 500 is transferred to the heat dissipation device 314 via the engagement of the heat transfer device 316 and the heat dissipation device 314, and a second portion 500b of the heat 500 is transferred to the chassis wall 316 via the engagement of the heat transfer device 316 and the chassis wall 316. While the heat transferred to the heat dissipation device 314 and the chassis wall 316 is discussed herein as being a "first portion" and a "second portion" of the heat 500, one of skill in the art in possession of the present disclosure will recognize that the portions of the heat generated by the first heat producing component 308 and transferred to the heat dissipation device 314 and the chassis wall 316 may vary, and may be reduced during its transfer via a variety of cooling processes that may be present in the computing system 200 in addition to the primary active cooling and supplemental passive cooling discussed below.

Figure 5C:
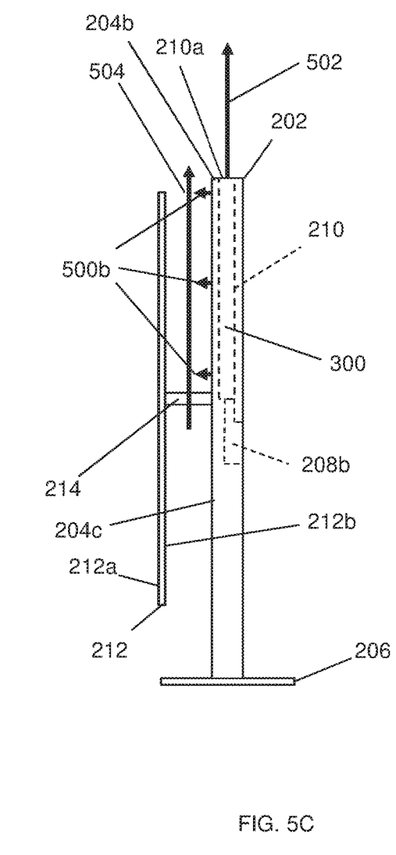
FIG. 5C is a side view illustrating the computing device of FIGS. 2A, 2B, and 2C being cooled.

The method 400 then proceeds to block 406 where a forced convective cooling device generates an airflow past a heat dissipation device to enable primary active cooling that dissipates the first portion of the heat producing by the heat producing component. Referring now to FIGS. 5B and 5C, in an embodiment of block 406, the forced convection device 312 may be operated to generate an airflow from air drawn in through the display stand chassis housing air inlet 208b and the computing chassis housing air inlet 318a, and direct that airflow past the heat dissipation fins 314a on the heat dissipation device 314, and out of the computing chassis heat dissipation aperture 320 and the display stand heat dissipation aperture 210a. The airflow out of the computing chassis heat dissipation aperture 320 and the display stand heat dissipation aperture 210a causes the first portion 500a of the heat 500 generated by the heat producing component 308 and transferred to the heat dissipation device 314 to be dissipated to enable primary active cooling 502 of the first heat producing component 308.

The method 400 then proceeds to block 408 where the chassis wall(s) transfer the second portion of the heat generated by the heat producing component to a chassis wall outer surface to enable supplemental passive cooling that dissipates the second portion of the heat generated by the heat producing component. Referring now to FIGS. 5B and 5C, in an embodiment of block 408, the second portion 500b of the heat 500 generated by the first heat producing component 308 is transferred through the computing chassis wall that includes the computing chassis bottom outer surface 302c, and to the display stand chassis wall 204b via the engagement of the computing chassis bottom outer surface 302c and the display stand chassis wall 204b. The display stand chassis wall 204b then transfers that second portion 500b of the heat 500 to the display stand chassis outer surface 204c. The transfer of heat via the computing chassis wall and the display stand chassis wall causes the second portion 500b of the heat 500 generated by the heat producing component 308 and transferred to the display stand chassis outer surface 204c to be dissipated (i.e., via natural convection) to enable supplemental passive cooling 504 of the first heat producing component 308. While one of skill in the art in possession of the present disclosure will recognize that the transfer of the second portion 500b of the heat 500 generated by the first heat producing component 308 to the display stand chassis outer surface 204c may cause that display stand chassis outer surface 204c to become relatively hot, the orientation of the display stand chassis outer surface 204c such that it faces the second surface (i.e., the rear surface) of the display device 212 has been found to prevent any issues associated with increased surface temperatures, as that orientation places the display stand chassis outer surface 204c in a location that is not engaged by a user of the computing system 2020.

Thus, systems and methods have been described that provide a heat pipe/vapor chamber in a computing chassis that engages each of a processing system, a computing chassis wall of the computing chassis, and a heat sink included in the computing chassis, with the computing chassis located in a display stand chassis. When the processing system produces heat, the heat pipe/vapor chamber transfers a first portion of the heat from the processing system to the heat sink, and a fan or blower operates to produce an airflow past that heat sink and out of an air outlet in the computing chassis and display stand chassis to provide for primary active cooling of the processing system. In addition, a second portion of the heat from the processing system is transferred by the heat pipe/vapor chamber to the computing chassis wall, and the computing chassis wall transfers that second portion of the heat to the display stand chassis wall, which transfers that second portion of the heat to a display stand chassis outer surface. The second portion of the heat transferred to the display stand chassis outer surface allows for natural convective that provides for supplemental passive cooling of the processing system. As such, supplemental cooling is provided to processing systems which, in some cases, may provide for increased operations (e.g., "burst mode") to be enabled in those processing systems, as well as reduced size and/or cost requirements for fans, heat sinks, heat pipes, and/or other thermal components.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi-chassis cooling system, comprising:
   a first chassis;
   a heat producing component that is located in the first chassis and that is configured to generate heat;
   a heat transfer device that is located in the first chassis and that engages the heat producing component and the first chassis, wherein the engagement of the heat producing component, the heat transfer device, and the first chassis provides for the transfer of heat from the heat producing component, through the heat transfer device, and to the first chassis;
   a heat dissipation aperture that is defined by the first chassis;
   a heat dissipation device that is located in the first chassis adjacent the heat dissipation aperture and that engages the heat transfer device, wherein the engagement of the heat dissipation device and the heat transfer device provides for the transfer of heat from the heat transfer device to the heat dissipation device such that the heat dissipation device dissipates that heat via the heat dissipation aperture; and
   a second chassis that includes a second chassis outer surface, wherein the first chassis is located in the second chassis such that the first chassis engages the second chassis, and wherein the engagement of the first chassis and the second chassis provides for the transfer of heat from the first chassis to the second chassis such that the second chassis dissipates that heat via the second chassis outer surface.

2. The system of claim 1, further comprising:
   a forced convection device that is located in the first chassis adjacent the heat dissipation device, wherein the forced convection device is configured to generate an airflow past the heat dissipation device and out of the first chassis through the heat dissipation aperture to dissipate the heat transferred from the heat transfer device to the heat dissipation device via the heat dissipation aperture.

3. The system of claim 1, further comprising:
   a display device including a display screen that is located on the display device; and
   at least one support member extending between the second chassis and display device.

4. The system of claim 3, wherein the heat producing component is provided by a processing system that is coupled to the display device.

5. The system of claim 1, wherein the heat transfer device is provided by a heat pipe.

6. The system of claim 1, wherein the heat dissipation device is provided by a finned heat sink.

7. An Information Handling System (IHS), comprising:
   a computing chassis;
   a computing device that is located in the computing chassis and that is configured to generate heat;
   a heat transfer device that is located in the computing chassis and that engages the computing device and the computing chassis, wherein the engagement of the computing device, the heat transfer device, and the computing chassis provides for the transfer of heat from the computing device, through the heat transfer device, and to the computing chassis;
   a computing chassis heat dissipation aperture that is defined by the computing chassis;
   a heat dissipation device that is located in the computing chassis adjacent the heat dissipation aperture and that engages the heat transfer device, wherein the engagement of the heat dissipation device and the heat transfer device provides for the transfer of heat from the heat transfer device to the heat dissipation device such that the heat dissipation device dissipates that heat via the computing chassis heat dissipation aperture; and
   a display support chassis that includes a display support chassis outer surface, wherein the computing chassis is located in the display support chassis such that the computing chassis engages the display support chassis, and wherein the engagement of the computing chassis and the display support chassis provides for the transfer of heat from the computing chassis and to the display support chassis such that the display support chassis dissipates that heat via the display support chassis outer surface.

8. The IHS of claim 7, further comprising:
a forced convection device that is located in the computing chassis adjacent the heat dissipation structure, wherein the forced convection device is configured to generate an airflow past the heat dissipation structure and out of the computing chassis through the computing chassis heat dissipation aperture to dissipate the heat transferred from the heat transfer device to the heat dissipation structure via the computing chassis heat dissipation aperture.

9. The IHS of claim 7, further comprising:
a display device including a display screen that is located on the display device; and
at least one support member extending between the display support chassis and the display device.

10. The IHS of claim 9, wherein the computing device is provided by a processing system that is coupled to the display device.

11. The IHS of claim 7, further comprising:
a display stand base provided on the display stand chassis; and
a display stand chassis heat dissipation aperture that is defined by the display stand chassis and that is located immediately adjacent the computing chassis heat dissipation aperture and on the display stand chassis opposite the display stand chassis from the display stand base.

12. The IHS of claim 7, wherein the heat transfer device is provided by a heat pipe.

13. The IHS of claim 7, wherein the heat dissipation device is provided by a finned heat sink.

14. A method for providing supplemental passive cooling, comprising:
generating, by a heat producing component that is located in a first chassis, heat;
transferring, by a heat transfer device that is located in the first chassis and that engages the heat producing component and the first chassis, at least a portion of the heat generated by the heat producing component to the first chassis;
transferring, by the first chassis to a second chassis that houses the first chassis, the at least the portion of the heat generated by the heat producing component;
dissipating, by the second chassis via a second chassis outer surface included on the second chassis, the at least the portion of the heat generated by the heat producing component and transferred via the first chassis;
transferring, by the heat transfer device directly to a heat dissipation device that is located in the first chassis and that engages the heat transfer device, at least a portion of the heat generated by the heat producing component; and
dissipating, by the heat dissipation device via a first chassis heat dissipation aperture defined by the first chassis, the at least the portion of the heat generated by the heat producing component and transferred directly from the heat transfer device.

15. The method of claim 14, further comprising:
generating, by a forced convection device that is located in the first chassis adjacent the heat dissipation device, an airflow past the heat dissipation device and out of the first chassis heat dissipation aperture defined by the first chassis to dissipate the at least the portion of the heat generated by the heat producing component and transferred directly from the heat transfer device.

16. The method of claim 14, wherein at least one support member extends between the second chassis and a display device that includes a display screen.

17. The method of claim 16, wherein the heat producing component is provided by a processing system that is coupled to the display device.

18. The method of claim 14, wherein a second chassis base is located on the second chassis, and wherein a second chassis heat dissipation aperture is defined by the second chassis and is located immediately adjacent the first heat dissipation aperture and on the second chassis opposite the second chassis from the second chassis base.

19. The method of claim 14, wherein the heat transfer device is provided by a heat pipe.

20. The method of claim 14, wherein the heat dissipation device is provided by a finned heat sink.

* * * * *